(12) United States Patent
Otremba et al.

(10) Patent No.: US 9,824,958 B2
(45) Date of Patent: Nov. 21, 2017

(54) CHIP CARRIER STRUCTURE, CHIP PACKAGE AND METHOD OF MANUFACTURING THE SAME

(71) Applicant: Infineon Technologies Austria AG, Villach (AT)

(72) Inventors: Ralf Otremba, Kaufbeuren (DE); Josef Hoeglauer, Helmstetten (DE); Juergen Schredl, Mering (DE); Xaver Schloegel, Sachsenkam (DE); Klaus Schiess, Allensbach (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 74 days.

(21) Appl. No.: 13/784,923

(22) Filed: Mar. 5, 2013

(65) Prior Publication Data

US 2014/0252577 A1    Sep. 11, 2014

(51) Int. Cl.
*H01L 23/495*  (2006.01)
*H01L 23/00*  (2006.01)
*H01L 23/433*  (2006.01)
*H01L 23/498*  (2006.01)
*H01L 21/56*  (2006.01)

(52) U.S. Cl.
CPC ...... *H01L 23/49575* (2013.01); *H01L 21/561* (2013.01); *H01L 23/4334* (2013.01); *H01L 23/49562* (2013.01); *H01L 23/49861* (2013.01); *H01L 24/19* (2013.01); *H01L 24/20* (2013.01); *H01L 24/89* (2013.01); *H01L 24/97* (2013.01); *H01L 23/49558* (2013.01); *H01L 23/49586* (2013.01); *H01L 2224/24137* (2013.01); *H01L 2224/48247* (2013.01); *H01L 2224/49111* (2013.01); *H01L 2924/07802* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/181* (2013.01); *Y10T 29/49002* (2015.01)

(58) Field of Classification Search
CPC ......... H01L 23/49527; H01L 23/49575; H01L 23/495; H01L 23/49558; H01L 23/49586; H01L 2225/1029
USPC .................................................. 257/666, 708
See application file for complete search history.

(56) References Cited

U.S. PATENT DOCUMENTS 3,711,625 A * 1/1973 Dupuis ............. H01L 23/49558
                                                        156/261
5,138,587 A * 8/1992 Mason .......................... 367/136
(Continued)

FOREIGN PATENT DOCUMENTS

CN       101572237 A    11/2009
DE    102006021959 A1   11/2007
DE    102007017831 A1   10/2008

OTHER PUBLICATIONS

English Abstract of DE 102007017831 of May 7, 2013.

*Primary Examiner* — David Zarneke
(74) *Attorney, Agent, or Firm* — Viering, Jentschura & Partner mbB

(57) ABSTRACT

Various embodiments provide a chip carrier structure. The chip carrier structure may include a structured metallic chip carrier; encapsulating material at least partially filling the structure; wherein the main surfaces of the metallic chip carrier are free from the encapsulating material.

17 Claims, 11 Drawing Sheets

(56) References Cited

U.S. PATENT DOCUMENTS

| | | | |
|---|---|---|---|
| 5,527,740 A * | 6/1996 | Golwalkar | H01L 23/49575 257/E23.052 |
| 6,384,472 B1 | 5/2002 | Huang | |
| 6,774,499 B1 | 8/2004 | Yang | |
| 6,855,892 B2 * | 2/2005 | Komatsu | H05K 3/4069 174/256 |
| 7,102,209 B1 * | 9/2006 | Bayan et al. | 257/666 |
| 7,221,048 B2 * | 5/2007 | Daeche et al. | 257/690 |
| 7,329,957 B2 * | 2/2008 | Sakano et al. | 257/778 |
| 7,535,086 B2 * | 5/2009 | Merilo et al. | 257/676 |
| 7,759,777 B2 | 7/2010 | Otremba et al. | |
| 7,772,681 B2 * | 8/2010 | Joshi | H01L 21/561 257/666 |
| 7,795,710 B2 * | 9/2010 | Islam et al. | 257/666 |
| 7,800,217 B2 | 9/2010 | Otremba et al. | |
| 7,893,548 B2 * | 2/2011 | Quinones et al. | 257/787 |
| 7,947,532 B2 | 5/2011 | Otremba et al. | |
| 8,030,131 B2 | 10/2011 | Otremba et al. | |
| 8,076,184 B1 * | 12/2011 | Camacho | H01L 24/29 257/E21.499 |
| 8,227,908 B2 | 7/2012 | Otremba et al. | |
| 8,367,437 B2 * | 2/2013 | Yamaguchi | B29C 43/18 257/E33.059 |
| 8,551,820 B1 * | 10/2013 | Foster et al. | 438/123 |
| 8,691,631 B2 * | 4/2014 | Otremba | 438/124 |
| 8,716,859 B2 * | 5/2014 | Meyer | H01L 25/0655 257/738 |
| 8,907,487 B2 * | 12/2014 | Kim | H01L 23/5389 257/773 |
| 8,987,900 B2 * | 3/2015 | Kim | H01L 23/295 257/737 |
| 9,312,218 B2 * | 4/2016 | Choi | H01L 21/4853 |
| 2001/0013643 A1 * | 8/2001 | Nakanishi | H01L 23/49575 257/678 |
| 2001/0045627 A1 * | 11/2001 | Connah | H01L 23/49575 257/666 |
| 2002/0020897 A1 * | 2/2002 | Yamashita et al. | 257/666 |
| 2002/0030266 A1 * | 3/2002 | Murata | 257/698 |
| 2005/0017330 A1 * | 1/2005 | Diot et al. | 257/666 |
| 2005/0260796 A1 * | 11/2005 | Takahashi | 438/112 |
| 2006/0006504 A1 * | 1/2006 | Lee et al. | 257/666 |
| 2006/0151858 A1 * | 7/2006 | Ahn et al. | 257/666 |
| 2006/0261450 A1 * | 11/2006 | Siegel et al. | 257/666 |
| 2007/0045785 A1 | 3/2007 | Noquil et al. | |
| 2007/0200207 A1 * | 8/2007 | Ramos et al. | 257/666 |
| 2008/0001304 A1 * | 1/2008 | Kim | H01L 25/0657 257/777 |
| 2008/0017907 A1 * | 1/2008 | Otremba | H01L 23/49575 257/306 |
| 2008/0135991 A1 * | 6/2008 | Harnden | H01L 23/49503 257/666 |
| 2009/0093090 A1 * | 4/2009 | Ewe | H01L 23/3107 438/123 |
| 2009/0236702 A1 | 9/2009 | Quinones et al. | |
| 2011/0001224 A1 * | 1/2011 | San Antonio et al. | 257/666 |
| 2011/0108971 A1 | 5/2011 | Ewe et al. | |
| 2011/0278707 A1 * | 11/2011 | Chi | H01L 21/76802 257/676 |
| 2011/0285009 A1 * | 11/2011 | Chi | H01L 21/561 257/693 |
| 2012/0007216 A1 * | 1/2012 | Choy | H01L 23/49575 257/607 |
| 2012/0049334 A1 * | 3/2012 | Pagaila | H01L 21/568 257/666 |
| 2012/0178216 A1 | 7/2012 | Otremba | |
| 2013/0154118 A1 * | 6/2013 | Do et al. | 257/778 |
| 2014/0264790 A1 * | 9/2014 | Ewe | H01L 24/19 257/666 |
| 2015/0084171 A1 * | 3/2015 | Ma | H01L 21/486 257/676 |

* cited by examiner

CHIP CARRIER STRUCTURE, CHIP PACKAGE AND METHOD OF MANUFACTURING THE SAME

TECHNICAL FIELD

Various embodiments relate generally to a chip carrier structure, a chip package, a method of manufacturing a chip carrier structure, and a method of manufacturing a chip package.

BACKGROUND

Power semiconductor chips may be integrated into an electronic package, e.g. a through-hole-package (THP) or a surface-mounted-device (SMD).

Currently, standard power packages, e.g., TO218, TO220, TO247, TO251, can be used for power semiconductor chips (e.g. high volt (HV) power semiconductor chips) in power applications, e.g. for high-voltage applications of larger than 200V.

However, these standard power packages may result in significant switching losses (Pswitch [W]) due to the package inductances [nH] with the increasing current [A] requirements in the future.

FIG. 1 illustrates simulation results 100 of switching losses dependency on source pin inductance on a 45 mOhm J-FET (Junction Gate Field Effect Transistor).

As shown in FIG. 1, for various packages TO247, TO220, ThinPAK 8×8 and Blade HV used for the a 45 mOhm J-FET, their switching losses are all increasing with the increasing current. It is also shown that the switching losses for different packages TO247, TO220, ThinPAK and Blade HV are decreasing under the same current, with the TO247 package having the highest switching losses and the Blade HV package having the lowest switching losses. Accordingly, lower switching losses may be achieved with an optimized package, e.g. Blade HV and ThinPAK 8×8 packages, compared with TO220 and TO247 packages.

SUMMARY

Various embodiments provide a chip carrier structure. The chip carrier structure may include a structured metallic chip carrier; encapsulating material at least partially filling the structure; wherein the main surfaces of the metallic chip carrier are free from the encapsulating material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a chip carrier structure with good electrical and thermal performance, which may be used to realize a high volt (e.g. >200V) capable package. Various embodiments also provide a high volt (e.g. >200V) capable embedded package for power semiconductors.

Figure 1:
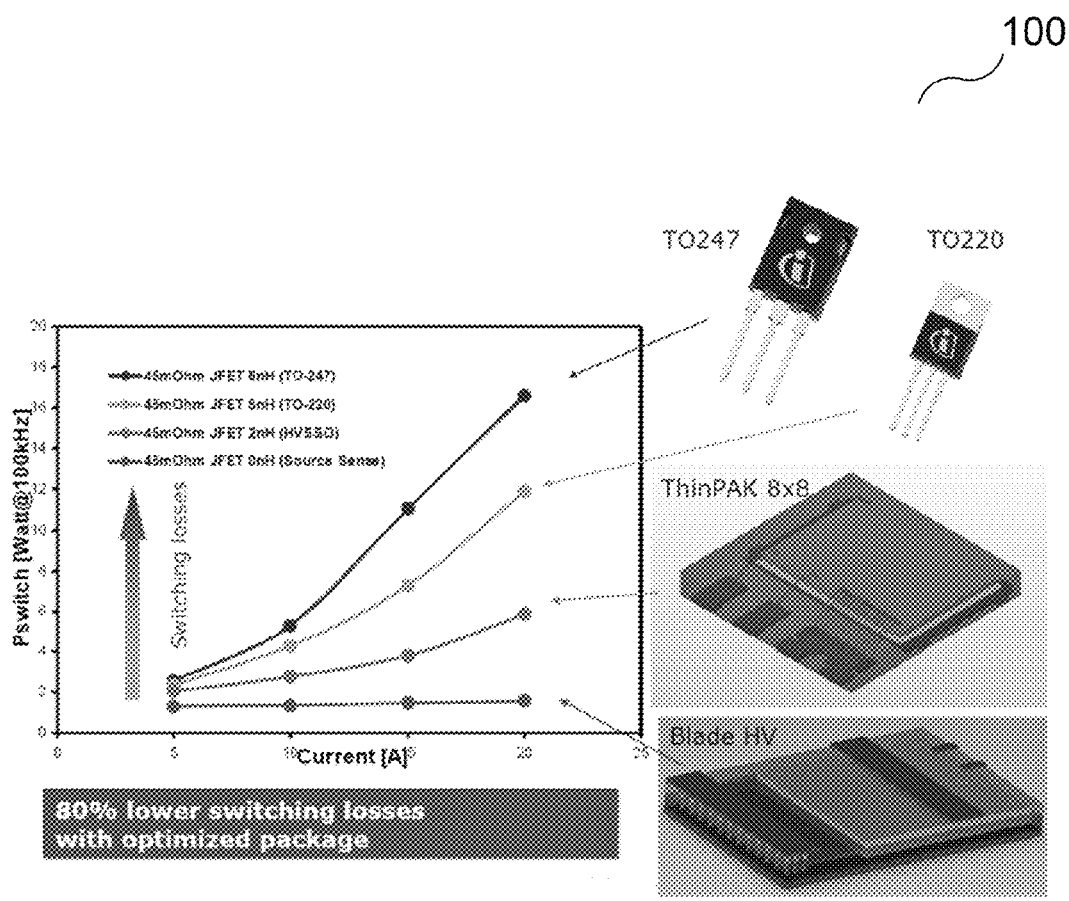
FIG. 1 illustrates simulation results of switching losses dependency on source pin inductance on a 45 mOhm Junction Gate Field Effect Transistor.
Figure 2:
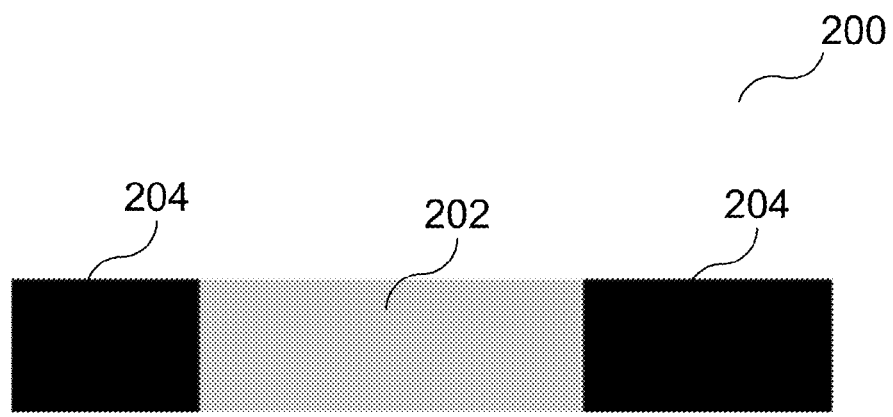
FIG. 2 shows a chip carrier structure according to various embodiments.

FIG. 2 shows a chip carrier structure 200 according to various embodiments.

The chip carrier structure 200 may include a structured metallic chip carrier (which may have been pre-structured before encapsulation) 202; encapsulating material 204 at least partially filling the structure 200; wherein the main surfaces (e.g. the top surface and the bottom surface) of the metallic chip carrier 202 are free from the encapsulating material 204.

The structured metallic chip carrier 202 may include a leadframe. The leadframe may be made of a metal or a metal alloy, e.g. including a material selected from a group consisting of: copper (Cu), iron nickel (FeNi), steel, and the like.

In various embodiments, the encapsulating material 204 may include compression mold or other comparable material. The encapsulating material 204 may include mold compound, such as filled epoxy, e.g. epoxy filled with SiO.

In various embodiments, the chip carrier structure 200 may be configured as a power chip carrier structure, for carrying one or more power chips thereon.

Figure 3:
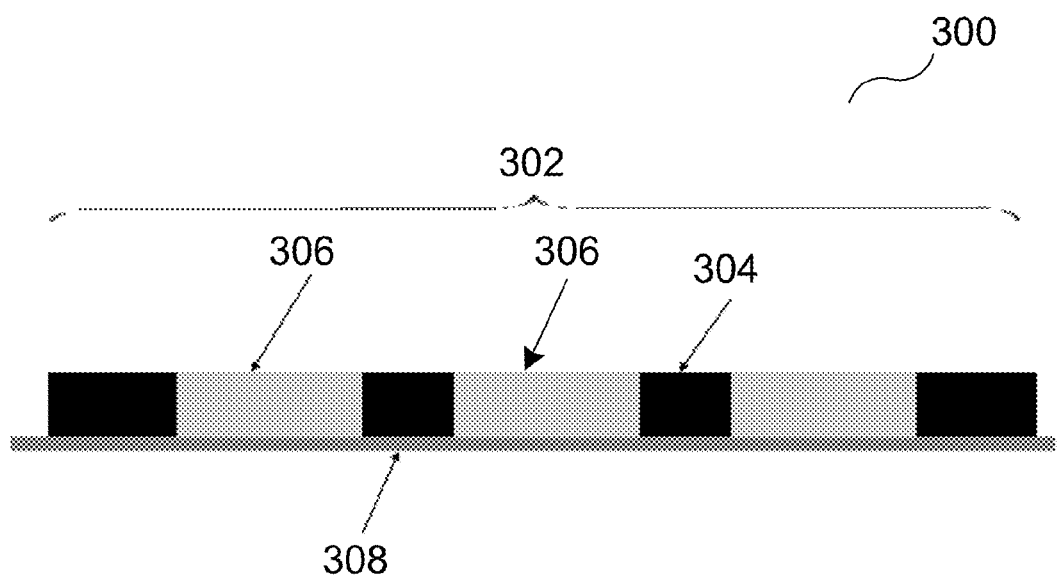
FIG. 3 shows a chip carrier structure according to various embodiments.

FIG. 3 shows a chip carrier structure 300 according to various embodiments.

Similar to the chip carrier structure 200 of FIG. 2, the chip carrier structure 300 may include a structured metallic chip carrier 302; encapsulating material 304 at least partially filling the structure 300; wherein the main surfaces (e.g. the top surface and the bottom surface) of the metallic chip carrier 302 are free from the encapsulating material 304. Various embodiments described with regard to the chip carrier structure 200 are analogously valid for the chip carrier structure 300.

In various embodiments of FIG. 3, the metallic chip carrier 302 may include a plurality of portions or blocks 306. For example, the plurality of portions 306 may be a plurality of leadframe portions. These leadframe portions 306 may be referred to as metal blocks.

In various embodiments, the chip carrier structure 300 may further include a foil 308 attached to one of the main surfaces of the metallic chip carrier 302. The foil 308 may be used for cooling or for isolation.

In accordance with various embodiments of FIG. 2 and FIG. 3 above, a chip carrier structure is provided with encapsulating material at least partially filling the structure. In various embodiments, such a chip carrier structure may also be referred to as a pre-molded leadframe.

The chip carrier structure may be used for power components, such as High Electron Mobility Transistors (HEMT), e.g., GaN (Gallium Nitride) HEMT, SiC (Silicon Carbide) HEMT, or High-voltage Si (Silicon) HEMT; or low-voltage (e.g., smaller than 200V) MOSFET (p-channel or n-channel), e.g. a SFET (silicon field effect transistor).

The chip carrier structure may be used for multi-chip-modules, which may include, e.g. a half bridge circuit or a cascade circuit formed by multiple chips.

The chip carrier structure may be used for a standard chip package or an embedded chip package.

The chip carrier structure according to various embodiments allows to realize a high volt capable (e.g. >200V) embedded package, since the required electrical (e.g. creep distance) and thermal (e.g. heat capacity) performance in addition to the low inductance requirement may be built-in with the chip carrier structure independent from the embedding process. With the chip carrier structure of various embodiments, the creep distance in the range from about 1 mm to about 10 mm (e.g. in the range from about 3 mm to about 8 mm, e.g. in the range from about 4 mm to about 6 mm) may be achieved. The embedding process is applied to the chip carrier structure of various embodiments to form a chip package of various embodiments, and allows an integration capability in addition to the desired low inductance (e.g. <1 nH).

Figure 4:
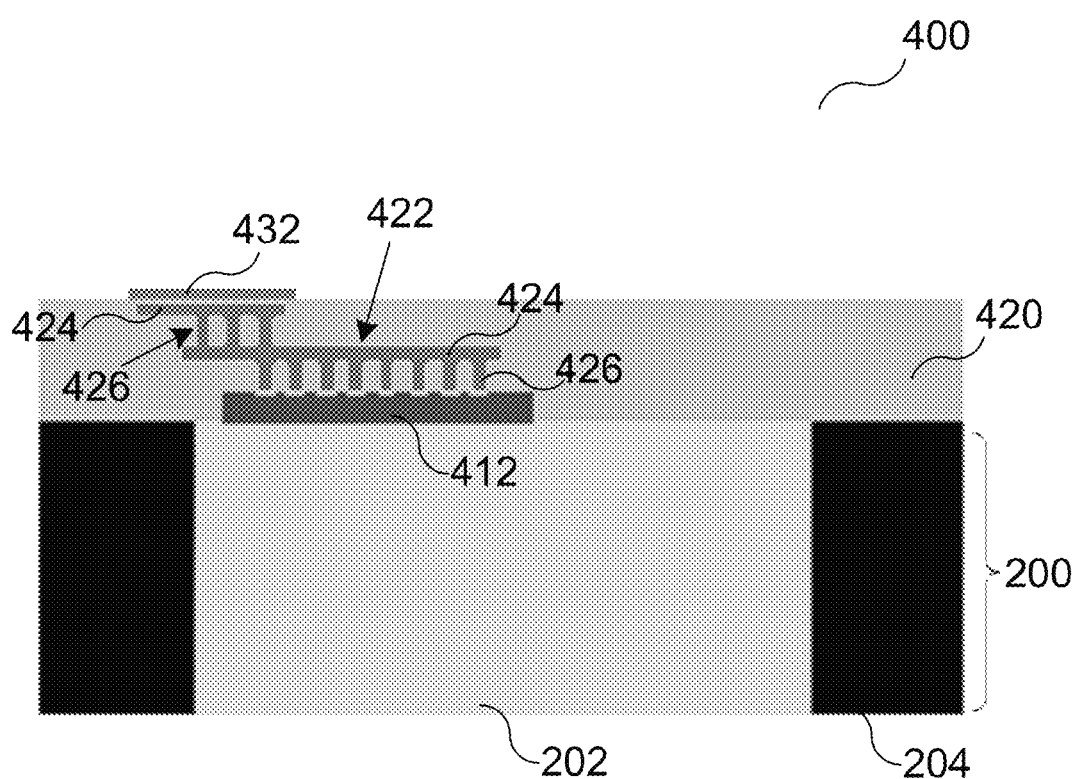
FIG. 4 shows a chip package according to various embodiments.

FIG. 4 shows a chip package 400 according to various embodiments.

The chip package 400 may include a chip carrier structure 200 as shown in FIG. 2. The chip carrier structure 200 may include a structured metallic chip carrier 202 and encapsulating material 204 at least partially filling the structure; wherein the main surfaces of the metallic chip carrier 202 are free from the encapsulating material 204.

Various embodiments described in the chip carrier structure 200 of FIG. 2 above are analogously valid for the chip package 400.

The structured metallic chip carrier 202 may include a leadframe. The encapsulating material 204 may include mold compound, such as filled epoxy, e.g. epoxy filled with SiO. In various embodiments, the chip carrier structure 200 may be configured as a power chip carrier structure, for carrying one or more power chips thereon.

The chip package 400 may further include a chip 412 arranged over the chip carrier structure 200 and an encapsulation structure 420 formed over the chip 412, wherein the encapsulation structure 420 may include an electrically conductive redistribution structure 422. At least one contact pad 432 may be formed over the encapsulation structure 420, wherein the at least one contact pad 432 is electrically coupled to the chip 412 via the electrically conductive redistribution structure 422.

In various embodiments, the chip package 400 may include adhesive (not shown in FIG. 4) between the chip 412 and the structured metallic chip carrier 202 to adhere the chip 412 to the structured metallic chip carrier 202. In various embodiments, the adhesive may be an insulating adhesive, in which case the chip carrier structure 200 may be used as a cooling structure. In various embodiments, the adhesive may be an electrically conductive adhesive, in which case the chip carrier structure 200 may be used to electrically connect the terminal of the chip 412 to the structured metallic chip carrier 202.

In various embodiments, the chip 412 may be free from the encapsulating material 204 at least partially filling the chip carrier structure 200. The encapsulating material 204, e.g. the mold compound, may only enclose the structured metallic chip carrier 202, or may additionally enclose the adhesive for die attaching the chip 412 with the chip carrier structure 200.

In various embodiment, the structured metallic chip carrier 202 may be configured as a power chip carrier structure. For example, a power chip 412 may be attached to the structured metallic chip carrier 202. The power chip 412 may include a power diode chip and/or a power transistor chip (e.g. a power MOSFET (metal oxide semiconductor field effect transistor), a JFET (junction field effect transistor), an IGBT (insulated gate bipolar transistor), a power bipolar transistor, or the like).

In various embodiments, the encapsulation structure 420 formed over the chip 412 may include a laminate. The laminate may include polymer material with glass fibers.

In various embodiments, the electrically conductive redistribution structure 422 may include one or more electrically conductive layers 424 (also referred to as redistribution layers), and contact holes 426 for electrically coupling the one or more electrically conductive layers 424 with the chip 412 and for electrically coupling the one or more electrically conductive layers 424 with each other. For example, the embodiments of FIG. 4 shows an electrically conductive redistribution structure 422 having two redistribution layers 424, but in various other embodiments the electrically conductive redistribution structure 422 may include other number (e.g. one, three, four, . . . ) of redistribution layers.

Figure 5A:
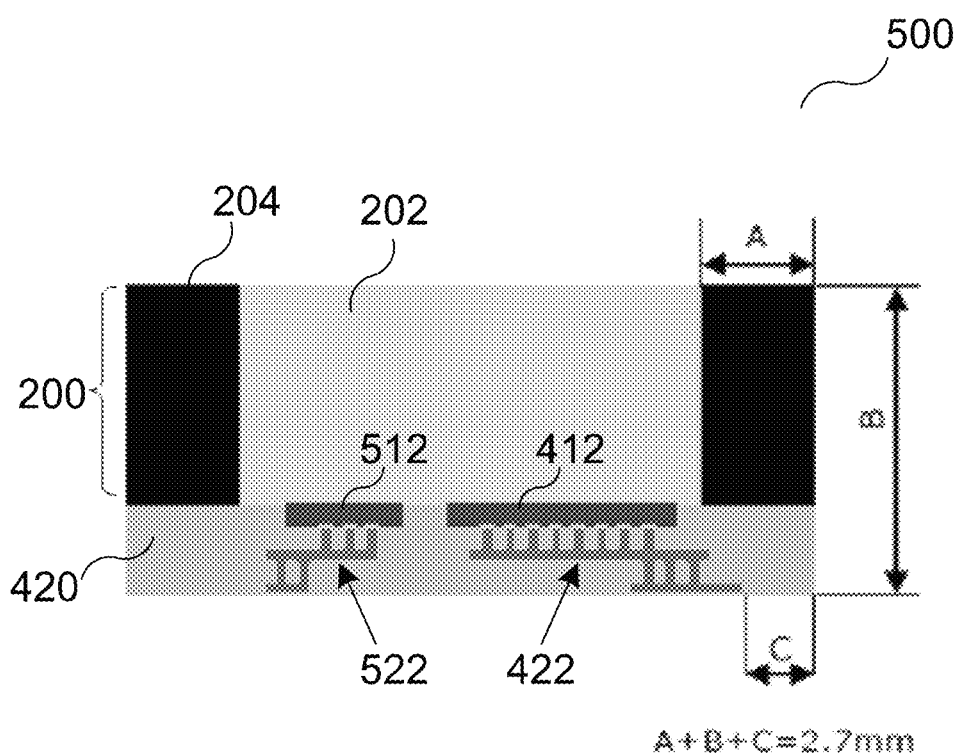
FIGS. 5A and 5B show a chip package according to various embodiments.

FIG. 5A shows a chip package 500 according to various embodiments.

In various embodiments of FIG. 5A, the chip package 500 includes various components of the chip package 400 shown in FIG. 4, and additionally includes a further chip 512 arranged over the chip carrier structure 200 and a further electrically conductive redistribution structure 522 included in the encapsulation structure 420. In various embodiments, the chip package 500 may include a plurality of chips (e.g. three, four, five, . . . ).

The chip package 500 may thus form a multi-chip package, wherein the chip 412 and the further chip 512 may be electrically coupled with each other, e.g. through the structured metallic chip carrier 202 and/or the electrically conductive redistribution structures 422, 522. In various embodiments, the chips 412, 512 may be electrically coupled with each other to form various circuitry, e.g. a halfbridge circuit, a cascade circuit, or the like.

In various embodiments, the sum of the dimensions A, B, C may be about 2.7 mm, wherein A represents the length of the encapsulating material 204, B represents the height of the chip package 500, and C represents the distance between the electrically conductive redistribution structures 422 and the edge of the chip package 500.

Figure 5B:
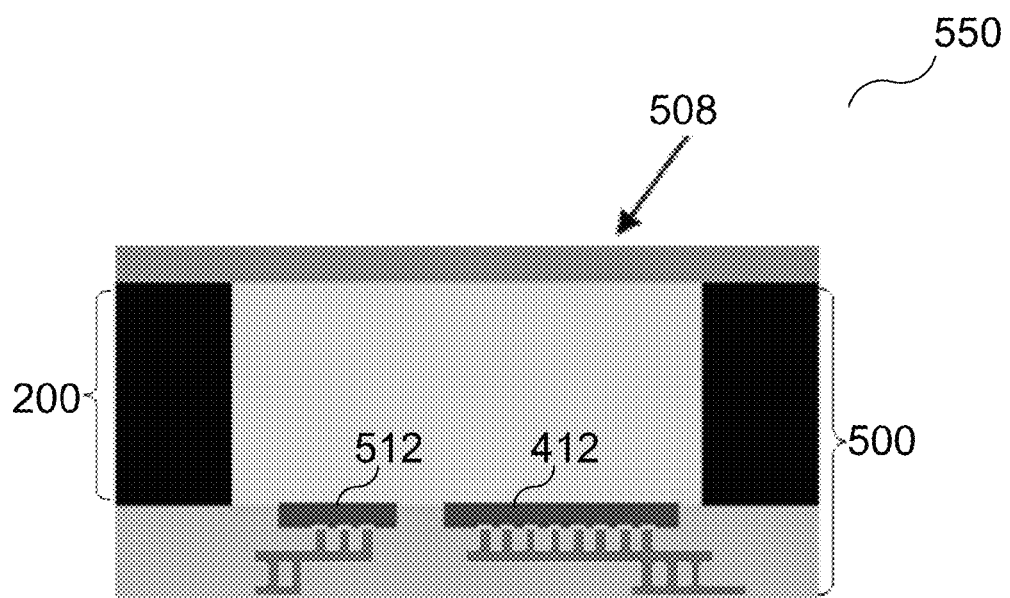

FIG. 5B shows a chip package 550 according to various embodiments.

The chip package 550 includes the chip package 500 of FIG. 5A, and may further include a foil 508 at one main surface of the chip carrier structure 200 opposite to the chips 412, 512. The foil 508 may be provided for cooling purposes.

The chip packages 500, 550 are shown in a flipped manner, which may be further mounted onto a printed circuit board, e.g. by means of SMD (surface-mounted-device) mounting.

Figure 6:
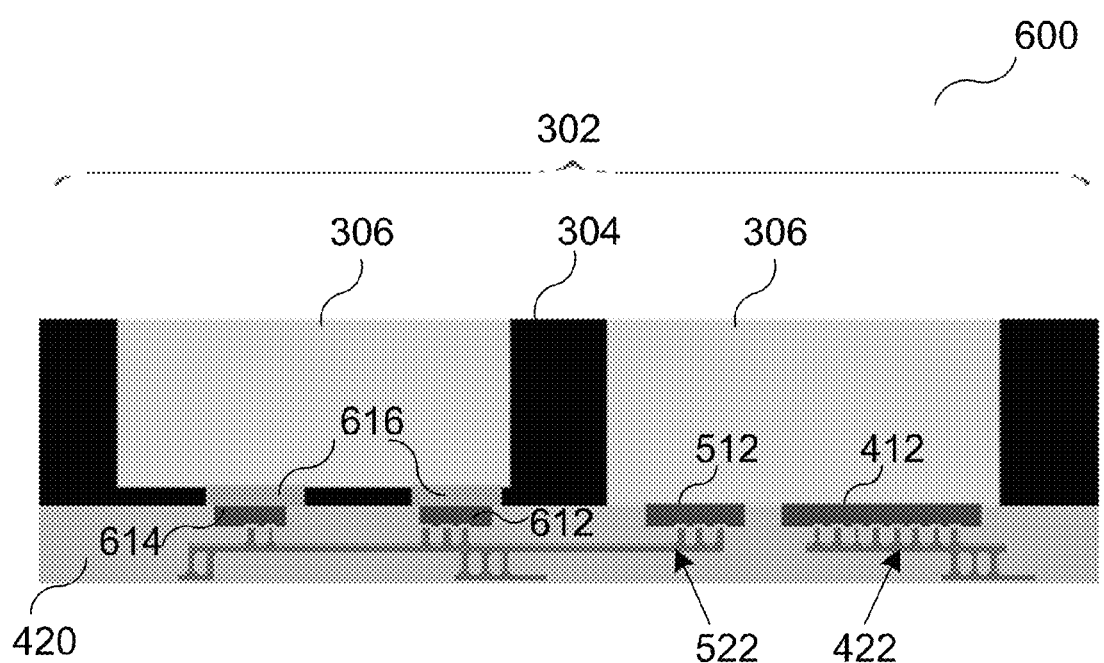
FIG. 6 shows a chip package according to various embodiments.

FIG. 6 shows a chip package 600 according to various embodiments.

In various embodiments of FIG. 6, the chip package 600 may include a chip carrier structure similar to FIG. 3, including a structured metallic chip carrier 302 and encapsulating material 304 at least partially filling the structure; wherein the main surfaces (e.g. the top surface and the bottom surface) of the metallic chip carrier 302 are free from the encapsulating material 304. The metallic chip carrier 302 may include a plurality of portions or blocks 306, e.g., a plurality of leadframe portions (also referred to as metal blocks).

Similar to the chip package 500 of FIG. 5A, the chip package 600 include a chip 412 and a further chip 512 arranged over the chip carrier structure, e.g. over a portion 306 of the metallic chip carrier 302. An encapsulation structure 420 may be formed over the chips 412, 512, wherein the encapsulation structure 420 may include an electrically conductive redistribution structure 422, 522 electrically coupled to the chips 412, 512. Various embodiments described with regard to the chip package 500 are analogously valid for the chip package 600.

The chip package 600 may further include additional chips 612, 614 arranged over another portion 306 of the metallic chip carrier 302, wherein the chips 612, 614 are electrically coupled with the electrically conductive redistribution structure 522.

In this embodiment, the chips 612, 614 are attached to the portion 306 of the metallic chip carrier 302 through a layer 616 of insulating material, e.g. insulating adhesive. In this case, the chips 612, 614 may be electrically insulated from the metallic chip carrier 302, and the metallic chip carrier 302 may serve as a cooling structure for the chips 612, 614.

In various embodiments, the chips 612, 614 may include a logic chip, e.g. a driver chip. The logic chip may include at least one logic device from the group consisting of: an ASIC (Application Specific Integrated Circuit), a driver, a controller, a sensor. The chips 412, 512 may include a power chip, e.g. a power diode and/or a power transistor chip. The logic chips 612, 614 may be used for controlling the power chips 412, 512.

Figure 7A:
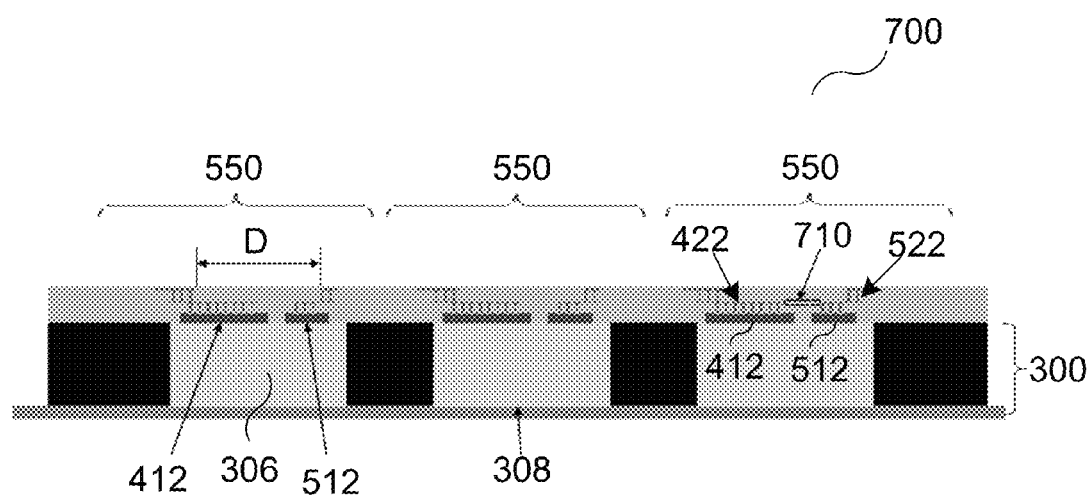
FIG. 7A shows a package according to various embodiments.

FIG. 7A shows a package 700 according to various embodiments.

The package 700 may include a plurality of chip packages 550 shown in FIG. 5, which are formed over the chip carrier structure 300 of FIG. 3 including a foil 308.

In various embodiments, a respective pair of the chips 412, 512 are arranged over a respective portion 306 of the structured metallic chip carrier. In various embodiments, the chip 416 may be a HEMT, such as a GaN HEMT, or an SiC HEMT, or a High-voltage Si HEMT. The chip 512 may be a low-voltage (e.g., smaller than 200V) MOSFET (p-channel or n-channel), such as an SFET.

The electrically conductive redistribution structure 422, 522 may include one or more redistribution layers, which may help to reach desired creepage requirements. For example, a creep distance D of 2.7 mm may be achieved in the chip package of various embodiments.

It is understood that the chips 412, 512 may be various types of power transistors described above. In an illustrative embodiment, the chip 412 may be a GaN HEMT and the chip 512 may be a SFET.

The GaN HEMT chip 412 may be arranged with its source electrode facing the portion 306 of the metallic chip carrier, and the SFET chip 512 may be arranged with its drain electrode facing the portion 306 of the metallic chip carrier. The source electrode of the GaN HEMT chip 412 and the drain electrode of the SFET chip 512 may be electrically connected with each other through the portion 306 of the metallic chip carrier.

In various embodiments, the GaN HEMT chip 412 may be arranged with its gate electrode facing and electrically coupled with the electrically conductive redistribution structure 422, and the SFET chip 512 may be arranged with its source electrode facing and electrically coupled with the electrically conductive redistribution structure 522. The gate electrode of the GaN HEMT chip 412 may be electrically coupled with the source electrode of the SFET chip 512, e.g. through the electrically conductive redistribution structure 422, 522, and the node point between the gate electrode of the GaN HEMT chip 412 and the source electrode of the SFET chip 512 is shown at 710.

Accordingly, the GaN HEMT chip 412 and the SFET chip 512 arranged and connected in such a manner may form a cascade circuit 800 shown in FIG. 8 which will be described below.

Although the chips 412, 512 are shown on the same portion 306 of the metallic chip carrier in FIG. 6 and FIG. 7A, a single portion 306 may include one or more leadframe parts for electrical coupling between the chips 412, 512 through the metallic chip carrier.

Figure 7B:
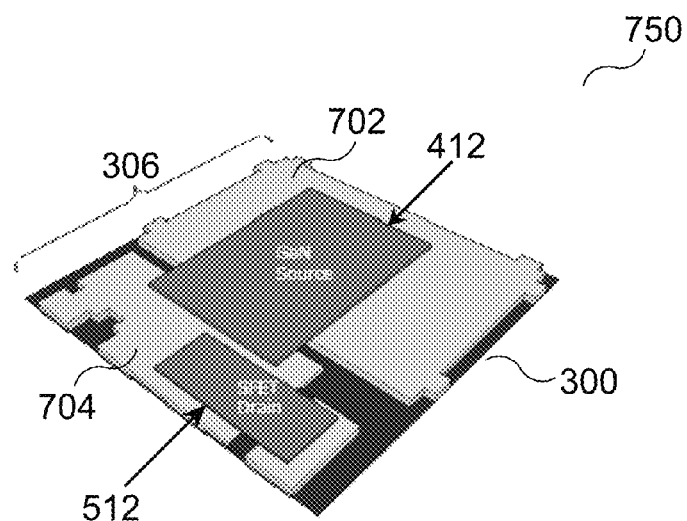
FIG. 7B shows a chip arrangement according to various embodiments.

FIG. 7B shows a chip arrangement 750 corresponding to the chip package 500 included in the package 700 of FIG. 7A, according to various embodiments.

As shown in FIG. 7B, a single portion 306 of the chip carrier structure 300 may include a first leadframe part 702 and a second leadframe part 704. The GaN HEMT chip 412 may be arranged over the first leadframe part 702, and the SFET chip 512 may be arranged over the second leadframe part 704. According to various embodiments, the source electrode of the GaN HEMT chip 412 may face the first leadframe part 702, and the drain electrode of the SFET chip 512 may face the second leadframe part 704. In various embodiments, the source electrode of the GaN HEMT chip 412 may be electrically coupled with the second leadframe part 704, so as to be electrically coupled with the drain electrode of the SFET chip 512.

In various embodiments, a single portion 306 of the chip carrier structure 300 may include various number of leadframe parts, depending on the arrangement of the chips 412, 512.

The various embodiments of FIG. 7B may be similarly applied to the structures of FIGS. 2 to 4, 5A, 5B, 6, 7A above.

In the embodiments described with reference to FIG. 7A and FIG. 7B above, the GaN chip 412 may be a high voltage (e.g. larger than 200V) HEMT switch and the SFET chip 512 may be a low voltage (e.g. smaller than 200V) power MOSFET. The GaN HEMT 412 is a normally on device, and is transformed to a normally off transistor with introducing of the low-voltage SFET 512. Such a GaN—SFET arrangement may correspond to the cascade circuit 800 of FIG. 8. The chip package 700 may be suitable for a normally off GaN.

The cascade circuit 800 may include a low voltage SFET 512 in common-source and a high voltage GaN—HEMT 412 in common-gate configuration. The resulting 3-port circuit may act as a switch. The drain electrode of the GaN—HEMT 412 is defining the 600V behavior of the cascade circuit 800.

Figure 8:
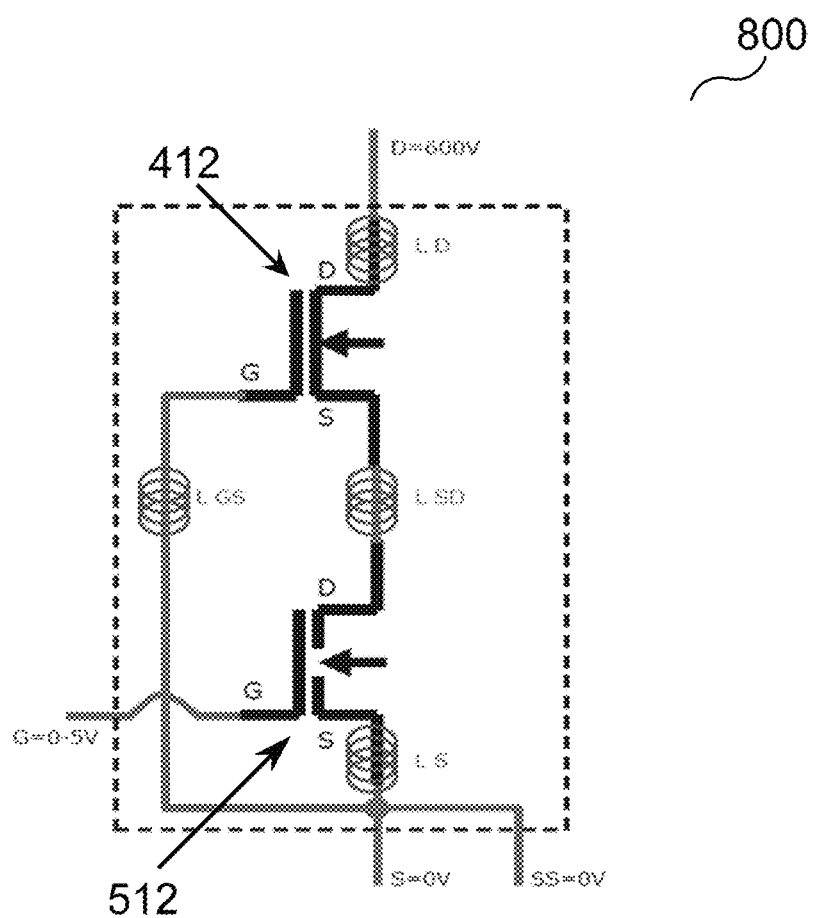
FIG. 8 shows a cascade circuit according to various embodiments.

The chips 412, 512 may also be connected differently to form other types of circuit instead of the cascade circuit 800 of FIG. 8.

Figure 9:
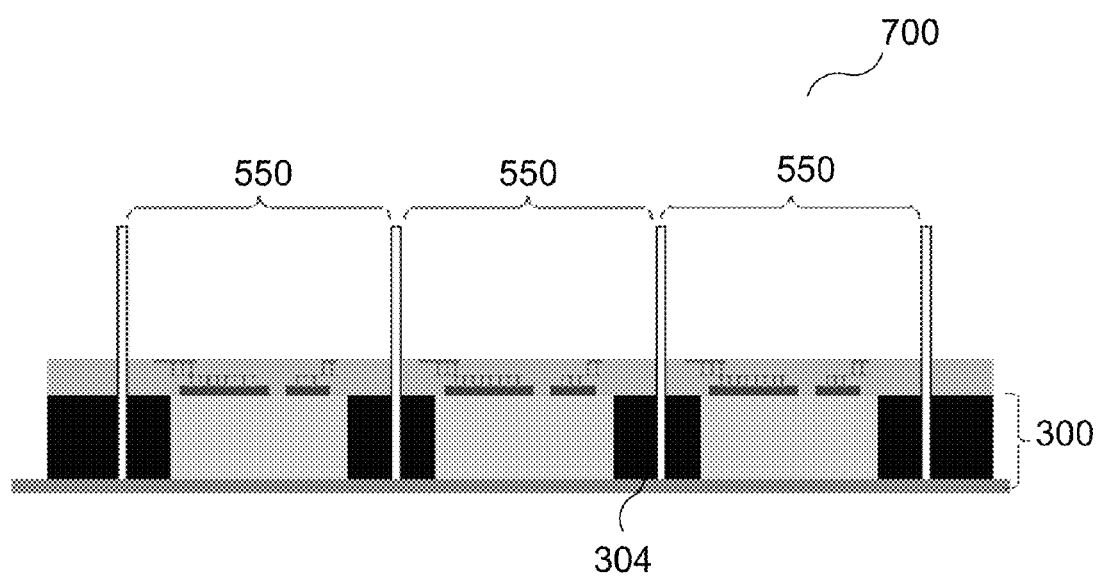
FIG. 9 shows a package according to various embodiments.

FIG. 9 shows a diagram in which the package 700 of FIG. 7A may be singulated to form individual chip packages, e.g. respective chip packages 550 of FIG. 5B.

The singulation may be performed via standard sawing mainly through the encapsulation material 304 of the chip carrier structure 300. For example, the encapsulation material 304, e.g. the mold, may have a thickness of about 1000-1500 μm, and a resin blade having a width of about 100 μm may be used for the sawing process.

As described above, the chip carrier structure 200, 300 of various embodiments above may serve as a basis for a chip package, e.g. an embedded chip package. One or more chips may be connected to the chip carrier structure 200, 300, e.g. by adhering, soldering, sintering, etc.; and may be galvanically re-distributed or re-wired via the electrically conductive redistribution structure, e.g. to form the package 700 of FIG. 7A. After the galvanic re-distribution or re-wiring, the package 700 may be singulated to form the individual chip packages, e.g. the chip packages 400, 500, 550, 600 described above. The individual chip packages may be further mounted onto a printed circuit board, e.g. by means of SMD mounting.

The chip carrier structure of various embodiments provides optimized (thick) thermal capacity and can satisfy desired creepage requirements.

The chip package of various embodiments combines pre-molding (i.e. the encapsulating material of the chip carrier structure, e.g. the mold compound) and embedding (i.e. the encapsulation structure over the chip, e.g. the laminate), and achieves low inductivity, low drain-source on-state resistance ($R_{DS(on)}$), optimized thermal capacity and can satisfy high volt creepage requirements.

Figure 10:
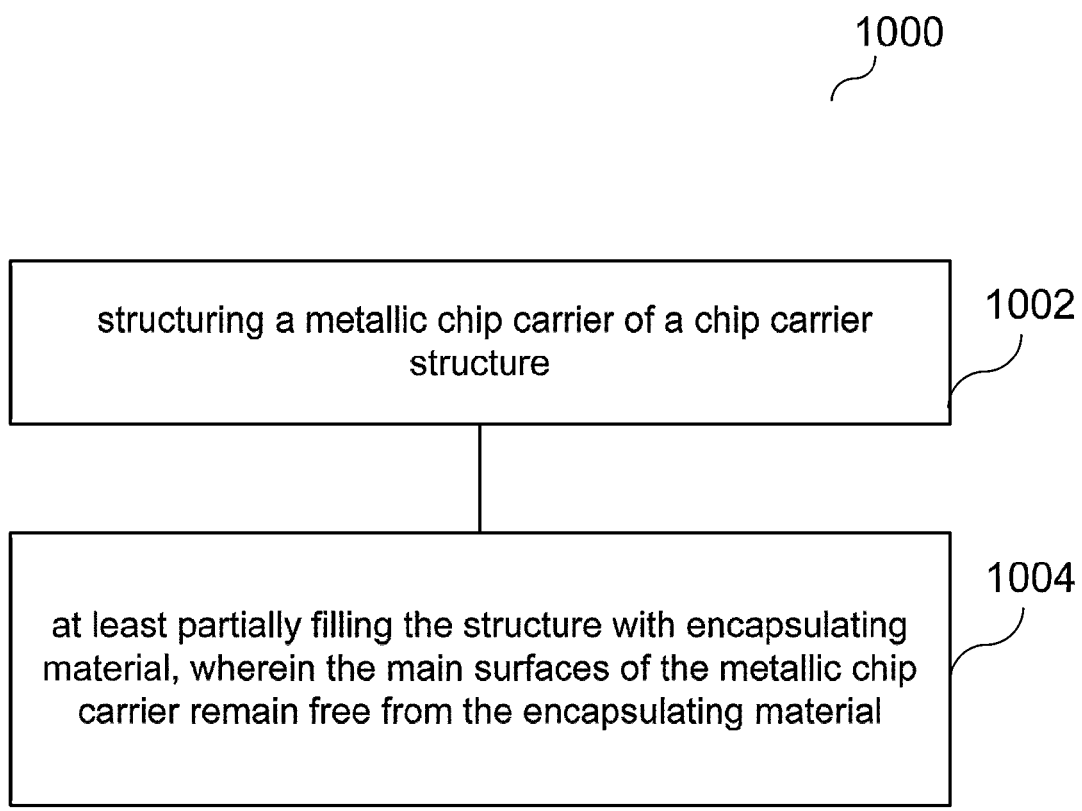
FIG. 10 shows a flowchart illustrating a method of manufacturing a chip carrier structure according to various embodiments.

FIG. 10 shows a flowchart 1000 illustrating a method of manufacturing a chip carrier structure according to various embodiments.

At 1002, a metallic chip carrier of the chip carrier structure may be structured.

At 1004, the chip carrier structure may be at least partially filled with encapsulating material, wherein the main surfaces of the metallic chip carrier remain free from the encapsulating material.

In various embodiment, the structured metallic chip carrier may include a leadframe In various embodiments, the encapsulating material may include mold compound, such as filled epoxy, e.g. epoxy filled with SiO.

Various embodiments of the chip carrier structure described above are analogously valid for the method of manufacturing a chip carrier structure.

Figure 11:
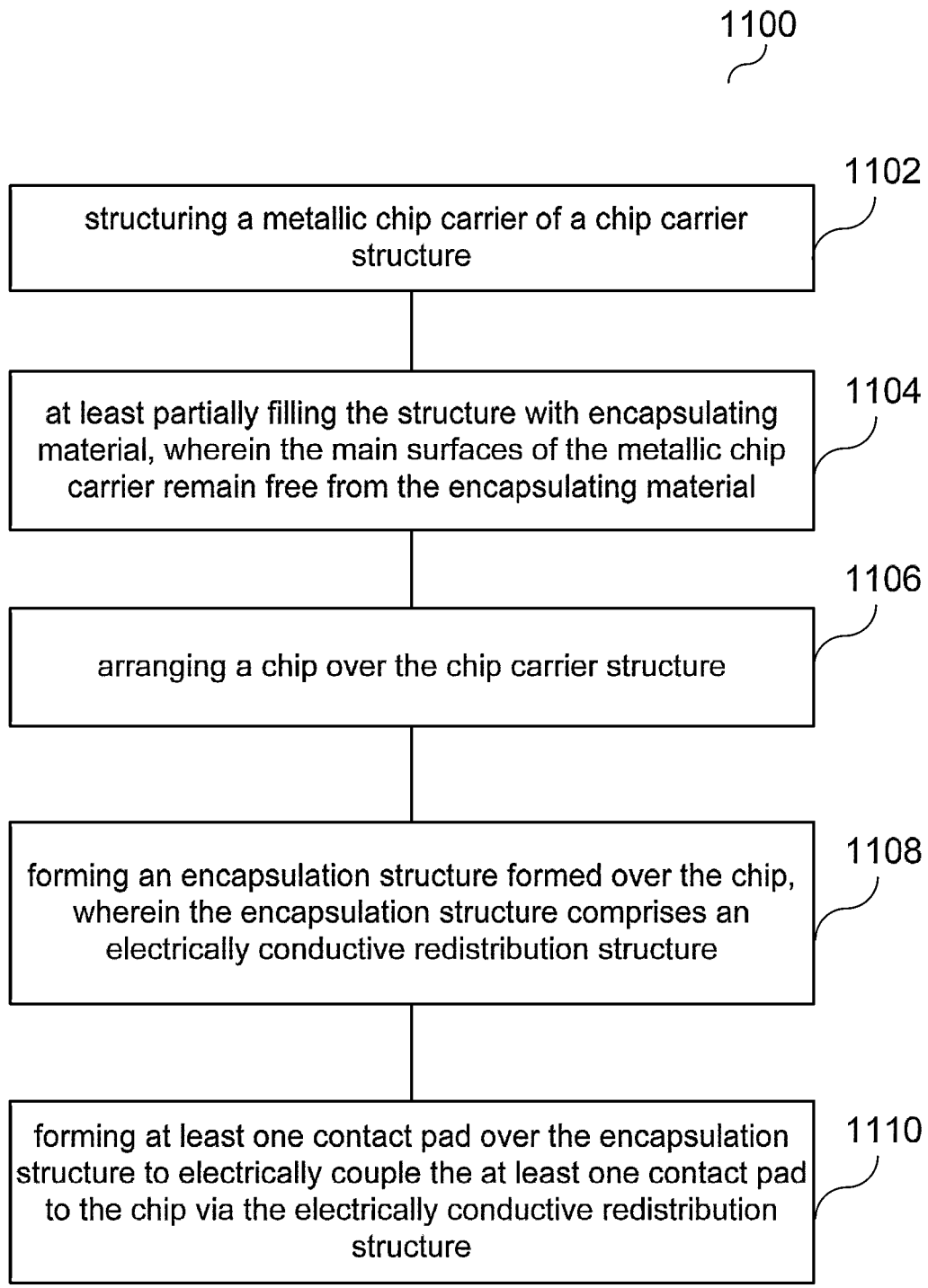
FIG. 11 shows a flowchart illustrating a method of manufacturing a chip package according to various embodiments.

FIG. 11 shows a flowchart 1100 illustrating a method of manufacturing a chip package according to various embodiments.

At 1102, a metallic chip carrier of a chip carrier structure may be structured.

At 1104, the chip carrier structure may be at least partially filled with encapsulating material, wherein the main surfaces of the metallic chip carrier remain free from the encapsulating material.

At 1106, a chip may be arranged over the chip carrier structure.

At 1108, an encapsulation structure may be formed over the chip, wherein the encapsulation structure may include an electrically conductive redistribution structure.

At 1110, at least one contact pad may be formed over the encapsulation structure to electrically couple the at least one contact pad to the chip via the electrically conductive redistribution structure.

In various embodiments, the structured metallic chip carrier may include a leadframe.

In various embodiments, the encapsulating material may include mold compound, such as filled epoxy, e.g. epoxy filled with SiO.

In various embodiment, the encapsulation structure may include a laminate.

In various embodiments, the chip may be free from the encapsulating material at least partially filling the structure.

According to various embodiments, the method may further forming adhesive between the chip and the structured metallic chip carrier to adhere the chip to the structured metallic chip carrier. The adhesive may be an insulating adhesive, or an electrically conductive adhesive.

Various embodiments of the chip package described above are analogously valid for the method of manufacturing a chip package.

Various embodiments provide a chip carrier structure. The chip carrier structure may include a structured metallic chip carrier; encapsulating material at least partially filling the structure; wherein the main surfaces of the metallic chip carrier are free from the encapsulating material.

The structured metallic chip carrier may include a leadframe. The leadframe may be made of a metal or a metal alloy, e.g. including a material selected from a group consisting of: copper (Cu), iron nickel (FeNi), steel, and the like. The metallic chip carrier may include a plurality of portions or blocks, the plurality of potions or blocks may be isolated from each other via the insulating material.

In various embodiments, the encapsulating material may include compression mold or other comparable material. The encapsulating material may include mold compound, such as filled epoxy, e.g. epoxy filled with SiO.

In various embodiments, the chip carrier structure may be configured as a power chip carrier structure, for carrying one or more power chips thereon.

In various embodiments, the chip carrier structure may further include a foil attached to one of the main surfaces of the metallic chip carrier. The foil may be used for cooling or for isolation.

Various embodiments provide a chip package. The chip package may include a chip carrier structure. The chip carrier structure may include a structured metallic chip carrier and encapsulating material at least partially filling the structure; wherein the main surfaces of the metallic chip carrier are free from the encapsulating material. The chip package may further include a chip arranged over the chip carrier structure and an encapsulation structure formed over the chip, wherein the encapsulation structure may include an electrically conductive redistribution structure. The chip package may further include at least one contact pad formed over the encapsulation structure, wherein the at least one contact pad is electrically coupled to the chip via the electrically conductive redistribution structure.

The structured metallic chip carrier may include a leadframe. The encapsulating material may include mold compound, such as filled epoxy, e.g. epoxy filled with SiO. In various embodiments, the chip carrier structure may be configured as a power chip carrier structure, for carrying one or more power chips thereon.

In various embodiments, the chip package may include adhesive between the chip and the structured metallic chip carrier to adhere the chip to the structured metallic chip carrier. In various embodiments, the adhesive may be an insulating adhesive, in which case the chip carrier structure may be used as a cooling structure. In various embodiments, the adhesive may be an electrically conductive adhesive, in which case the chip carrier structure may be used to electrically connect the terminal of the chip to the structured metallic chip carrier.

In various embodiments, the chip may be free from the encapsulating material at least partially filling the chip carrier structure. In various embodiments, the encapsulating material, e.g. the mold compound, may only enclose the structured metallic chip carrier, or may additionally enclose the adhesive for die attaching the chip with the chip carrier structure.

In various embodiment, the structured metallic chip carrier may be configured as a power chip carrier structure. For example, a power chip may be attached to the structured metallic chip carrier. The power chip may include a power diode chip and/or a power transistor chip (e.g. a power MOSFET (metal oxide semiconductor field effect transistor), a JFET (junction field effect transistor), an IGBT (insulated gate bipolar transistor), a power bipolar transistor, or the like).

In various embodiments, the encapsulation structure formed over the chip may include a laminate. The laminate may include polymer material with glass fibers.

In various embodiments, the electrically conductive redistribution structure may include one or more electrically conductive layers (also referred to as redistribution layers), and contact holes for electrically coupling the one or more electrically conductive layers with the chip and for electrically coupling the one or more electrically conductive layers with each other.

Various embodiments provide a method of manufacturing a chip carrier structure. The method may include structuring a metallic chip carrier; at least partially filling the structure with encapsulating material; wherein the main surfaces of the metallic chip carrier remain free from the encapsulating material.

In various embodiment, the structured metallic chip carrier may include a leadframe In various embodiments, the encapsulating material may include mold compound, such as filled epoxy, e.g. epoxy filled with SiO.

Various embodiments provide a method of manufacturing a chip package. The method may include manufacturing a chip carrier structure, which may include structuring a metallic chip carrier; at least partially filling the structure with encapsulating material; wherein the main surfaces of the metallic chip carrier remain free from the encapsulating material. The method may further include arranging a chip over the chip carrier structure; forming an encapsulation structure formed over the chip, wherein the encapsulation structure comprises an electrically conductive redistribution structure; and forming at least one contact pad over the encapsulation structure to electrically couple the at least one contact pad to the chip via the electrically conductive redistribution structure.

In various embodiments, the structured metallic chip carrier may include a leadframe.

In various embodiments, the encapsulating material may include mold compound, such as filled epoxy, e.g. epoxy filled with SiO.

In various embodiment, the encapsulation structure may include a laminate.

In various embodiments, the chip may be free from the encapsulating material at least partially filling the structure.

According to various embodiments, the method may further forming adhesive between the chip and the structured metallic chip carrier to adhere the chip to the structured metallic chip carrier. The adhesive may be an insulating adhesive, or an electrically conductive adhesive.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip carrier structure, comprising:
at least one metal block;
encapsulating material disposed on at least two sides of the at least one metal block;
wherein the main surfaces of the at least one metal block are free from the encapsulating material;
at least a portion of a first chip disposed on a first metal block of the at least one metal block;
at least a portion of a second chip at least partially disposed on the first metal block; where the first chip and the second chip are electrically coupled together by the first metal block; and
an encapsulating laminate structure formed over the first chip and the second chip.

2. The chip carrier structure of claim 1,
wherein the at least one metal block comprises a leadframe.

3. The chip carrier structure of claim 1,
wherein the encapsulating material comprises mold compound.

4. The chip carrier structure of claim 1,
configured as a power chip carrier structure.

5. The chip carrier structure of claim 1,
wherein the encapsulating laminate structure comprises a glass material.

6. The chip carrier structure of claim 1, wherein the first chip and the second chip are electrically coupled together in a manner selected from the group consisting of:
a source electrode of the first chip is electrically coupled to a drain electrode of the second chip;
a source electrode of the second chip is electrically coupled to a drain electrode of the first chip; and
combinations thereof.

7. A chip package, comprising:
a chip carrier structure, comprising:
at least one metal block;
encapsulating material disposed on at least two sides of the at least one metal block;

wherein the main surfaces of the at least one metal block are free from the encapsulating material;

at least a portion of a first chip disposed on a first metal block of the at least one metal block;

at least a portion of a second chip at least partially disposed on the first metal block; where the first chip and the second chip are electrically coupled together by the first metal block;

an encapsulation structure formed over the first chip and the second chip, wherein the encapsulation structure comprises an electrically conductive redistribution structure; and at least one contact pad formed over the encapsulation structure;

wherein the at least one electrically conductive redistribution structure is configured to electrically couple at least one of the first chip and the second chip to the at least one contact pad and wherein the encapsulation structure comprises a laminate.

8. The chip package of claim 7,
wherein the at least one metal block comprises a leadframe.

9. The chip package of claim 7,
wherein the encapsulating material comprises mold compound.

10. The chip package of claim 7,
wherein the first chip is free from the encapsulating material at least partially filling the structure.

11. The chip package of claim 7, further comprising:
adhesive between the first chip and the at least one metal block to adhere the first chip to the at least one metal block.

12. The chip package of claim 11,
wherein the adhesive is an electrically conductive adhesive.

13. The chip package of claim 7,
wherein the chip carrier structure is configured as a power chip carrier structure.

14. The chip package of claim 7, wherein the at least one electrically conductive redistribution structure comprises at least one contact hole.

15. The chip package of claim 7, wherein the at least one electrically conductive redistribution structure is configured to electrically couple the first chip and the second chip together.

16. A metallic chip carrier structure, comprising:
a plurality of metal blocks;
encapsulating material disposed on at least two sides of each metal block of the plurality of metal blocks;
wherein the main surfaces of each metal block of the plurality of metal blocks is free from the encapsulating material;
at least a portion of a first chip disposed on a first metal block of the plurality of metal blocks;
at least a portion of a second chip at least partially disposed on the first metal block; where the first chip and the second chip are electrically coupled together by the first metal block; and
an encapsulating laminate structure formed over the first chip and the second chip.

17. The chip carrier structure of claim 16, further comprising a third chip and a fourth chip disposed on a second metal block of the plurality of metal blocks.

* * * * *